(12) United States Patent
Anderson et al.

(10) Patent No.: US 7,134,112 B1
(45) Date of Patent: Nov. 7, 2006

(54) INCREMENTAL ROUTING IN INTEGRATED CIRCUIT DESIGN

(75) Inventors: Jason H. Anderson, Toronto (CA); Vinay Verma, San Jose, CA (US); Sandor S. Kalman, Santa Clara, CA (US)

(73) Assignee: Xilinx, Inc., San Jose, CA (US)

(*) Notice: Subject to any disclaimer, the term of this patent is extended or adjusted under 35 U.S.C. 154(b) by 291 days.

(21) Appl. No.: 10/624,615

(22) Filed: Jul. 21, 2003

Related U.S. Application Data

(60) Provisional application No. 60/398,520, filed on Jul. 24, 2002.

(51) Int. Cl.
*G06F 17/50* (2006.01)

(52) U.S. Cl. .............................. 716/13; 716/12; 716/14

(58) Field of Classification Search .................... 716/2, 716/5, 6, 7, 11–14
See application file for complete search history.

(56) References Cited

U.S. PATENT DOCUMENTS

| | | | | |
|---|---|---|---|---|
| 5,790,414 | A * | 8/1998 | Okano et al. .................. | 716/13 |
| 5,963,728 | A * | 10/1999 | Hathaway et al. ............. | 716/3 |
| 6,269,468 | B1 * | 7/2001 | Dean et al. ..................... | 716/2 |
| 6,286,128 | B1 * | 9/2001 | Pileggi et al. ................. | 716/18 |
| 6,460,166 | B1 * | 10/2002 | Reddy et al. ................... | 716/2 |
| 6,480,991 | B1 * | 11/2002 | Cho et al. ...................... | 716/8 |
| 6,557,145 | B1 * | 4/2003 | Boyle et al. ................... | 716/2 |
| 6,622,291 | B1 * | 9/2003 | Ginetti .......................... | 716/9 |
| 6,757,879 | B1 * | 6/2004 | Kong et al. ................... | 716/10 |
| 6,766,504 | B1 * | 7/2004 | Rahut et al. .................. | 716/13 |

OTHER PUBLICATIONS

Vaughn Betz, Jonathan Rose; "FPGA Routing Architecture: Segmentation and Buffering to Optimize Speed and Density"; 10 pages.
Dijkstra, E.; A Note on Two Problems in Connexion with Graphs, Numerishe Mathematik 1; 1959; 2 pages. attached publication from book: 25.2 Dijkstra's algorithm—pp. 527-531.
L. McMurchie, C. Ebeling; "PathFinder: A Negotiation-Based Performance-Driven Router for FPGAs"; Proc. of the Feb. 1995; 1995 ACM Third International Symposium on Field-Programmable Gate Arrays Aided Design; 7 pages.
C. Y. Lee, "An Algorithm for Path Connections and its Applications," IRE Transactions on Electronic Computers, vol. EC=10, Sep. 1961, pp. 346-365.
Ravi Nair, "A Simple Yet Effective Technique for Global Wiring"; IEEE Transactions on Computer-Aided Design, vol. CAD-6, No. w; Mar. 1987; Copyright 1987 IEEE; pp. 165-171.

* cited by examiner

*Primary Examiner*—Vuthe Siek
(74) *Attorney, Agent, or Firm*—H. C. Chan; Kim Kanzaki

(57) ABSTRACT

A method for completing the routing of a partially routed design is provided. The unrouted pins are routed to generate a first plurality of nets that may contain shorts or overlaps between the nets. The nets are analyzed to obtain timing information, and then divided into a set of critical and a set of non-critical nets. The non-critical nets are hidden, and the critical nets are rerouted to remove overlaps. The non-critical nets are then unhidden. The non-critical nets and rerouted critical nets are then rerouted so as to remove overlaps.

16 Claims, 2 Drawing Sheets

INCREMENTAL ROUTING IN INTEGRATED CIRCUIT DESIGN

FIELD OF THE INVENTION

This invention relates to computer-aided design (CAD), and specifically, to routing signals in an integrated circuit.

BACKGROUND OF THE INVENTION

The design process for integrated circuits contains a number of well known sequential operations. Initially, the proposed functionality of a circuit is analyzed by one or more chip designers. These designers then use design capture tools to describe the logical components of the circuit and their interactions. This step involves generating a description of the design to be implemented in an appropriate machine-readable form. One of the commonly used methods for specifying a design is a hardware description language (HDL). This language contains specific functions and syntax to allow complex hardware structures to be described in a compact and efficient way. Computer-aided design tools are available to compile or synthesize the HDL description specifying the design into lower forms of description. The output of these synthesis tools is a design database specifying the components of the design and how the components are interconnected. The components of a design may consist of large blocks that implement complex logic functions, memory blocks, logic gates, or other types of components.

The design database is then passed as input to a layout tool, which typically includes a placement tool (placer) and a routing tool (router). Placement is the process whereby each component (or design object) of the design is allocated to a physical position on the chip. The aim of the placer is to place connected design objects in close physical proximity to one another. This conserves space on the chip and increases the probability that the desired interconnections between components will be successfully completed by the router. Additionally, placing connected components close to one another generally improves the performance of the circuit, since long interconnect paths are associated with excess capacitance and resistance, resulting in longer delays.

After placement is complete, a routing step is performed. Many routing algorithms use a routing resource graph, $G(V, E)$, to represent the available routing resources in the target device (e.g., chip), where a node, $n \in V$, in the graph represents a conductor (e.g., wire) in the device and an edge, $e \in E$, is present between nodes corresponding to conductors that can be connected to one another. For example, in FPGA technology, edges are present between nodes whose conductors may be connected to one another through a programmable switch. Each component in the design being routed has a number of pins, which generate and receive electrical signals. Pins that generate signals are called source pins; pins that receive signals are called load pins. Each component pin corresponds to a node in the routing resource graph. A collection of pins that needs to be connected together in a logic design is called a net. The purpose of routing is to connect the pins in each net of a logic design. A net may have one or more source pins and one or more load pins. Signals are fed from source pins to load pins through an interconnection path chosen by the router. To route a load pin on a net, the router must identify a path through the routing resource graph from a source pin's node in the graph to the load pin's node in the graph. Each node in the graph has an associated cost, which is typically chosen based on a combination of factors, including the physical properties of the node's corresponding conductor (such as wire capacitance or wire length), as well as other factors related to the design being routed (such as the demand for the node amongst the nets of a the design). When a load pin is routed, it is desirable to use the minimum cost path from the source pin to the load. The minimum cost path is usually identified using a variant of Dijkstra's shortest path algorithm. More details can be found in Dijkstra, E., A Note on two Problems in Connexion with Graphs, Numerische Mathematik 1, 269–271, 1959.

After placement and routing, it is often necessary to verify that the design functions in ways expected by the designer. This verification may be achieved by simulation and analysis. During post-layout verification, the operation of the design is examined. After routing, the precise resistances and capacitances of a design's interconnections are known and consequently, post-layout timing analysis tools have an accurate picture of the circuit delays. Timing analysis tools can identify paths with excessive delay, detect setup and hold violations, and other timing errors. Other post-layout verification tools may check that the design functionality is correct and that it produces the correct output results for given input stimulus vectors. If post-layout verification is successful, the design process is complete and the design is implemented in the target technology. On the other hand, if verification is not successful, then incremental modifications to the design may be necessary, after which the design must again pass through some or all of the CAD flow. It is desirable if such iterations through the CAD flow after incremental circuit modifications can be performed quickly.

The design tools involved in the CAD flow that are used for HDL synthesis, placement and routing, verification and timing analysis of a design are commonly implemented in software executing on an engineering workstation.

Routing has a significant effect on the performance of the resulting circuit. As an example, if the interconnection paths selected by a router are not optimal, there may be excessive capacitance and resistance, leading to unacceptable delays and signal degradation. Further, routing is a computationally intensive operation, and it is desirable to reduce the execution time of routing. Consequently, it is important to develop improved routing methods and algorithms.

DETAILED DESCRIPTION OF THE INVENTION

The present invention relates to a new incremental routing method. Incremental routing refers to the scenario in which the router is given a partially routed design as input. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

Figure 1:
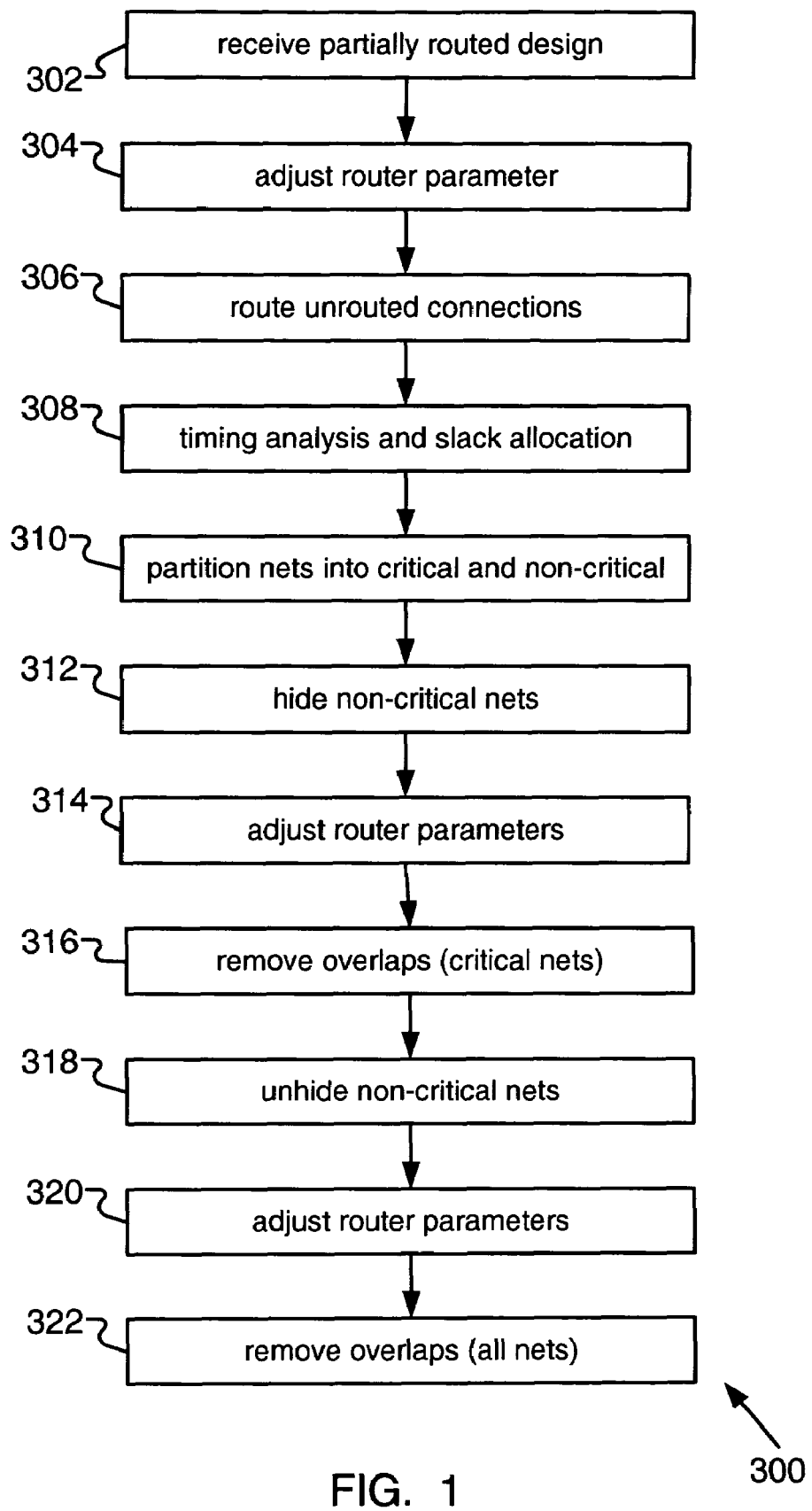
FIG. 1 is a flow chart showing an overview of an incremental router flow of the present invention.

FIG. 1 is a flow chart showing an overview of a router 300 of the present invention. In step 302, a partially routed design is received by the router. This design contains a plurality of nets that have not yet been routed. In step 304, parameters of the router are adjusted so that they are appropriate for this phase of incremental routing. Details of the choice of parameters will be disclosed below. In step 306, the unrouted pins in the design are routed. During this routing, it is permissible to create shorts between other nets and therefore, the result of this step is a completely routed design that generally contains shorts or overlaps between the routing for different nets. The overlaps between nets must be removed completely for the routing solution to be feasible. This is achieved by repeatedly selecting a net that is shorted with another net, ripping up a portion of the routing of the selected net, and re-routing the selected net with an increasing preference for avoiding the creation of new shorts with other nets. Additional details of this process can be found in L. McMurchie and C. Ebeling, "PathFinder: A Negotiation-Based Performance-Driven Router for FPGAs", Proc. of the 1995 ACM Third International Symposium on Field-Programmable Gate Arrays Aided Design, pp. 111–117, February 1995. In step 308, timing analysis is performed. This step may include calculating a slack value for each connection in the design. This slack value represents the criticality of the connection in terms of the design's timing constraints. A connection with a small slack is more timing critical than a connection with a large slack. The result provides an accurate picture of whether the design meets timing constraints. The subsequent steps pertain to removing the overlaps between nets to produce a feasible routing solution.

In step 310, the nets in the design are divided into two sets: critical and non-critical. In this embodiment, the critical nets are those that have connections with tight timing constraints, as determined in step 308. A threshold value can be used for the classification. For example, a net is a "critical" net if any pin on the net has a slack (determined in step 308) that is less than the threshold value. The threshold value can be determined on a case-by-case basis in accordance with user's requirements. In another embodiment, the nets may be partitioned using information from prior steps in the routing flow. Specifically, one can keep track of whether a pin on the net has been critical (e.g., had a slack less than a threshold value) in any of the previous route processing. If a pin on the net had been critical, then the net can be classified as critical in this step.

One aspect of the present invention is that the overlaps of the critical nets and non-critical nets are removed in separate operations. The rationale behind this is to give the critical nets the best opportunity to use the most desirable routing resources, for example, the routing resources with the best delay characteristics. The separation of the two overlap removal operations is realized by "hiding" the routing for the non-critical nets prior to removing overlaps from the critical nets (step 312). As a result, resource contentions from hidden nets are not "seen" during overlap removal from the critical nets. In step 314, the router parameters are adjusted so that they are appropriate for this phase of the operation. In step 316, overlaps are removed from the critical nets. After this overlap removal step, an overlap-free routing solution for the critical nets is generated.

In executing step 316, only critical nets that are shorted with other critical nets are considered for rip-up and re-route. The shorts between a critical and a non-critical net are not recognized, i.e., these shorts would not lead to the rip-up and re-route process. In order to achieve this objective, the non-critical nets are ignored (or "hidden") in these steps. The non-hidden nets will compete amongst themselves for routing resources, without competition from the hidden nets.

After the critical nets are routed, the non-critical nets are tackled. In step 318, the non-critical nets are unhidden. Unhiding a net is akin to making an invisible net visible to all other unhidden nets, i.e., it can contend for routing resources. Also shorts between this net and other nets are recognized by the router. At this point, overlaps may exist between non-critical nets and between critical and non-critical nets. In step 320, the router parameters are adjusted so that all remaining overlaps between nets can be removed. Overlap removal is invoked in step 322. After the completion of step 322, the result is an overlap-free routing solution for all nets in the design. In another embodiment of the invention, the nets are partitioned into more than two sets, based on timing criticality. For example, assume the nets were divided into three sets: A, B, and C, with set A containing the most critical nets. Overlaps would first be removed from the nets in set A. Following this, overlaps would be removed amongst the nets in sets A and B. Finally, overlaps would be removed in all of the nets, in sets A, B, and C.

The steps of adjusting router parameters (steps 304, 314 and 320) and routing unrouted connections (steps 306, 316 and 322) are described in detail here. In general, a router uses cost functions to evaluate routing decisions. To route a load pin on a net, the router identifies the minimum cost path through the routing graph from a source pin of the net to the load pin. The cost of a path is defined to be the sum of the individual node costs on the path. In one embodiment, the cost function C(n) of a node n can be written as:

$$C(n)=[In\_cost(n)+Cong\_hitory(n)]*[1+Share\_pen*contenders(n)]+Delay(n) \qquad (1)$$

where:
  In_cost(n) is the basic (or intrinsic) cost of using node n;
  Cong_history(n) is a scalar that represents the history of congestion on node n;
  Share_pen is a scalar value representing the cost of creating shorts between nets;
  Contenders(n) is the number of nets currently using node n; and
  Delay(n) is the cost related to the delay incurred through the use of the node n.

Note that equation (1) is just one of many ways to compute the cost of node n. Further, some of the terms in equation (1) may be zero. Other cost functions may include terms related to physical properties of the conductors corresponding to the node, such as capacitance or metal wire topology.

The selection of router parameters under steps 304, 314 and 320 is now described. In one embodiment, it is desirable to exert a minimal impact on already routed nets. Therefore, it is desirable to minimize the number of new shorts that are created in routing the unrouted pins. If equation (1) is used as the cost function, this can be achieved by setting the share_pen and cong_history(n) parameters to appropriate values. Specifically, before starting to route the unrouted pins, the share_pen parameter is set to a high value so as to minimize the creation of new shorts while allowing shorts to be created when warranted by connection criticality. For example, for a highly critical net, it may be desirable to route onto a fast routing resource even if that resource is already used by another net. Another way to achieve a similar effect is to use the cong_history parameter. For example, the cong_history parameter of the nodes (conductors) used in the routing of already-routed nets can be set to a high value, thereby penalizing the use of these nodes by other nets. In another embodiment, it may be desirable to adjust router parameters so that certain nets are given preference for the most desirable routing resources (for example, the routing resources with the least delay). In step 320, the overlaps amongst the critical nets have already been removed. It is desirable if during the overlap removal process for all nets (step 322), the routing for the critical nets is not disrupted when removing the overlaps from the non-critical nets. This can be accomplished by adjusting the cong_history parameter for the nodes used in the routing of the critical nets, and then, when removing overlaps in step 322, establishing a preference within the router for the rip-up and re-route of non-critical nets versus critical nets.

Figure 2:
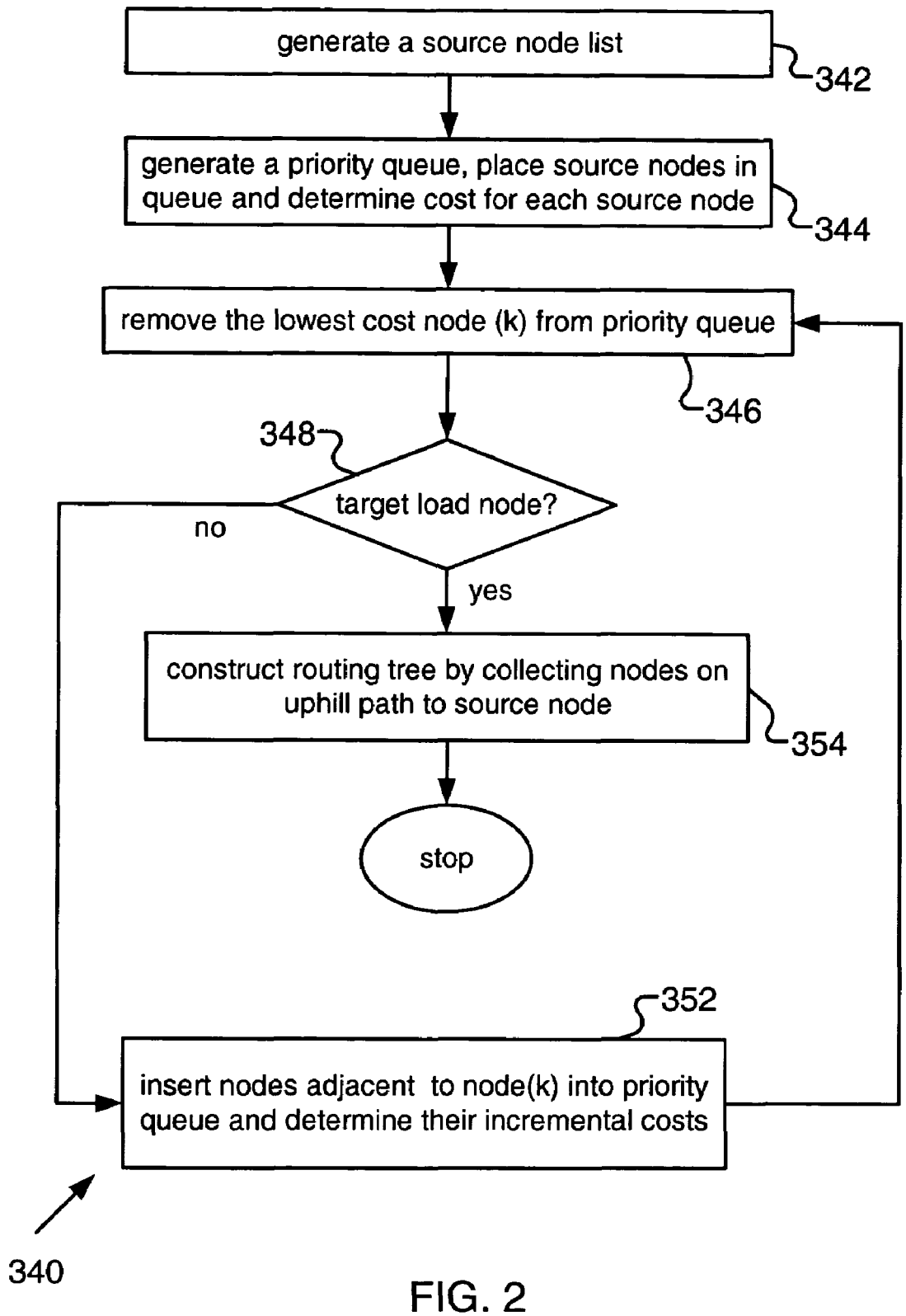
FIG. 2 is a flow chart of the steps in routing unrouted connections in accordance with the present invention.

An operation 340 of a router that can be used to execute steps 306, 316 and 322 is shown in FIG. 2. The process of FIG. 2 is applicable to route an individual load pin on a net. It can be repeated multiple times for nets with multiple load pins. In step 342, a list of source nodes is generated. The source nodes for a net are those nodes in the routing graph that correspond to conductors that are already part of the net's routing. In step 344, a priority queue is generated. The source nodes are placed in the priority queue, and their costs are determined. The costs of the source nodes can be chosen in various ways. In one embodiment, the costs of the source nodes are zero. In another embodiment, the costs of the source nodes are chosen based on the timing criticality of pins on the net being routed. For example, in this case, a high cost is given to a source node that, if used in the routing of the load pin being routed, will increase the delay of some other pin on the net. In a third embodiment, the costs of source nodes may depend on characteristics of the routing conductors and the connectivity of the routing graph, such as the locations where routing buffers are present. In step 346, the node (denoted by k) having the lowest cost is removed from the priority queue. It is determined whether this node is a target load node (step 348) corresponding to the load pin being routed. If it is not a target node, adjacent nodes to node k are inserted into the priority queue (step 352). The costs of these adjacent nodes are determined (see below). Operation 340 then branches back to step 346. If the node in step 348 is a target node, a routing tree is constructed by collecting all the nodes on the uphill path from the target node to a source node (step 354). This completes the routing between a source node and a load pin.

The cost, PQCost(m), of an adjacent node m in step 352 is determined by:

$$PQCost(m) = PQCost(k) + Cost(m); \quad (2)$$

where:
Cost(m) is the cost of node m, which can be calculated using equation (1) above; and
PQCost(k) is the total cost of node k. The total cost of node k is the sum of the cost of node k as calculated using equation (1) above and the costs of all the nodes on the uphill path from node k to a source node.

It can be seen from the above description that a novel incremental routing method has been disclosed. Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

What is claimed is:

1. A method for routing a partially routed design of an integrated circuit, the design containing unrouted pins, the method comprising:
   routing the unrouted pins to generate a first plurality of nets that contains a plurality of shorts or overlaps between nets;
   analyzing the first plurality of nets to obtain timing information;
   partitioning, based on the timing information, the first plurality of nets into a first and a second set of nets;
   hiding the first set of nets;
   rerouting a subset of the second set of nets to substantially remove all overlaps in the second set of nets;
   unhiding the first set of nets; and
   rerouting a subset of the first set of nets and a subset of the rerouted second set of nets to substantially remove the plurality of overlaps.

2. The method of claim 1 wherein the analyzing step includes calculating slack values for at least some of the plurality of nets and using the slack values in the partitioning step.

3. The method of claim 2 wherein the second set of nets are nets having pins with an associated slack value less than a predetermined value.

4. The method of claim 1 wherein the routing, rerouting the first set of nets and rerouting the second set of nets use different routing parameters.

5. The method of claim 4 wherein the routing parameters are used to determine costs associated with routing resources.

6. The method of claim 4 wherein the router parameters are adjusted so that one set of preferred nets is given preference to use routing resources.

7. The method of claim 6 wherein the routing resources used by the set of preferred nets are those having the best delay characteristics.

8. The method of claim 6 wherein the set of preferred nets is the set of nets having pins with low slack values.

9. The method of claim 1 wherein the step of rerouting the subset of the second set of nets further comprises a step of selecting one set of preferred nets that is given preference to use routing resources.

10. The method of claim 1 wherein the step of rerouting the subset of the first set of nets further comprising a step of selecting one set of preferred nets that is given preference to use routing resources.

11. The method of claim 1 wherein the design contains routed pins, and the routing step includes routing for a load pin on a net, the routing step comprises:
    identifying source nodes for the routing of the load pin, based on the net's pre-existing routing;
    assigning a cost for each of the source nodes;
    generating a priority queue;
    placing the source nodes in the priority queue;
    removing a node having lowest cost from the priority queue; and
    selecting one of two steps below:
      if the removed node is a target load pin node, constructing a routing tree by collecting nodes on an uphill path from the target load pin node to one of the source nodes; and
      if the removed node is not a target load pin node, adding to the priority queue nodes adjacent to the removed node and then performing the removing and selecting steps.

12. The method of claim 11 wherein the source nodes are assigned substantially zero costs.

13. The method of claim 11 wherein the source nodes are assigned costs based on timing.

14. The method of claim 11 wherein the source nodes are assigned costs based on characteristics of their corresponding conductors in the integrated circuit and their connectivity.

15. The method of claim 1 wherein the second set of nets contains routed pins, and the step of rerouting the second set of nets includes routing a load pin on a net in the second set of nets, the routing of the load pin comprises:

identifying source nodes for the routing of the load pin, based on the net's pre-existing routing;

assigning a cost for each of the source nodes;

generating a priority queue;

placing the source nodes in the priority queue;

removing a node having lowest cost from the priority queue; and selecting one of two steps below:

if the removed node is a target load pin node, constructing a routing tree by collecting nodes on an uphill path from the target load pin node to one of the source nodes; and if the removed node is not a target load pin node, adding to the priority queue nodes adjacent to the removed node and then performing the removing and selecting steps.

16. The method of claim 1 wherein the first set of nets contains routed pins, and the step of rerouting the first set of nets includes routing a load pin on a net in the first set of nets, the routing of the load pin comprises:

identifying source nodes for the routing of the load pin, based on the net's pre-existing routing;

assigning a cost for each of the source nodes;

generating a priority queue;

placing the source nodes in the priority queue;

removing a node having lowest cost from the priority queue; and selecting one of two steps below:

if the removed node is a target load pin node, constructing a routing tree by collecting nodes on an uphill path from the target load pin node to one of the source nodes; and if the removed node is not a target load pin node, adding to the priority queue nodes adjacent to the removed node and then performing the removing and selecting steps.

* * * * *